May 19, 1964 L. A. RUSSELL 3,134,023

PROTECTION OF TRANSISTOR CIRCUITS AGAINST PREDICTABLE OVERLOADING

Filed April 11, 1958 2 Sheets-Sheet 1

INVENTOR
LOUIS A. RUSSELL

BY *Alvin J. Riddles*
ATTORNEY

United States Patent Office 3,134,023

Patented May 19, 1964

3,134,023

PROTECTION OF TRANSISTOR CIRCUITS AGAINST PREDICTABLE OVERLOADING

Louis A. Russell, Poughkeepsie, N.Y., assignor to International Business Machines Corporation, New York, N.Y., a corporation of New York Filed Apr. 11, 1958, Ser. No. 727,878
17 Claims. (Cl. 307—88)

This invention relates to the use of semiconductor devices in circuitry containing an inductive load and, in particular to transistor driven magnetic core circuitry useful in information handling devices.

In the adapting of semiconductor devices to service as driving elements in circuitry wherein a large inductance is present, a problem has been encountered wherein the inductance during switching impresses upon the circuitry, voltage levels which, though transient in nature, may reach magnitudes considerably greater than the steady state voltage levels in the circuit. In order to prevent damage to the transistor or other semiconductor devices employed under these conditions, it has been found necessary in the past to overdesign the voltage handling capabilities of the semiconductor device. This overdesign then imposes on the circuitry limitations in the form of decreased frequency response and increased cost.

What has been discovered is a technique of control of the voltage supply impressed across the semiconductor active element in a circuit containing inductive reactance so that at times when large voltage transients appear in the circuit, the voltage level across the semiconductor device is reduced to a value that, when added to the transient, will not exceed the design voltage handling capability of the semiconductor device, and yet under all other conditions of normal operation, the semiconductor device used in the circuit will be of optimum design and need not be equipped with an excess in voltage handling capabilities.

A primary object of this invention is to provide a technique of circuit operation whereby inductive transients in the circuit are prevented from impressing excessive voltages on a semiconductor device.

Another object of this invention is to prevent an inductive voltage pulse produced by a change in state of an inductive element associated with a semiconductor device circuit from increasing the voltage applied across the semiconductor device.

Another object is to provide an improved semiconductor power handling circuit.

Still another object of the invention is to provide an improved magnetic core, transistor driving circuit.

Still another object of the invention is to prevent an inductive voltage pulse produced by a change in remanence state of a substantially rectangular hysteresis loop, switching transformer from increasing the emitter to collector voltage of a transistor connected, in series, with one winding of the transformer.

Other objects of the invention will be pointed out in the following description and claims and illustrated in the accompanying drawings, which disclose, by way of example, the principle of the invention and the best mode, which has been contemplated, of applying that principle.

Figure 1:
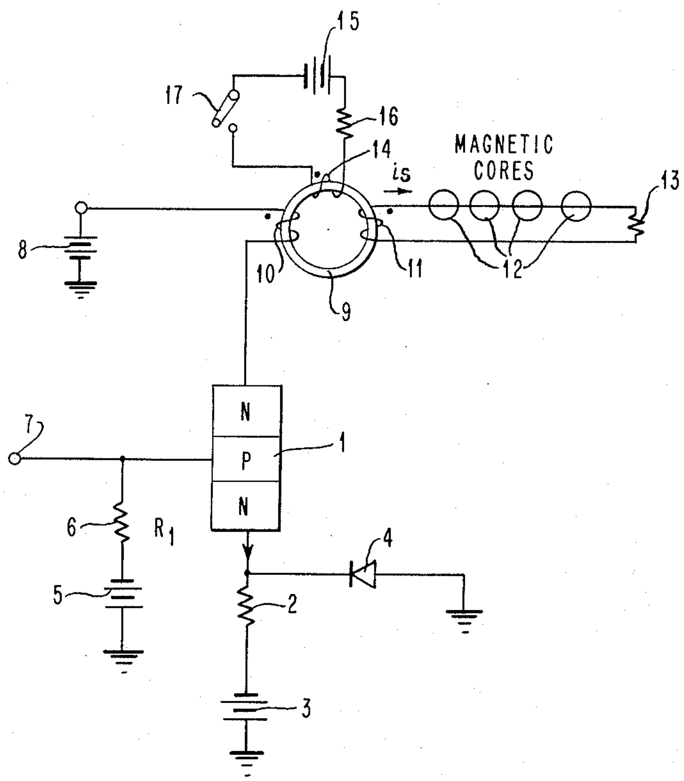
FIG. 1 PRIOR ART
FIGURE 1 is an illustration of a prior art magnetic core switching circuit illustrating the problem arising in transistor circuitry when inductive loads are placed on a transistor.

Referring now to FIGURE 1, as an illustration of a transistor circuit containing an inductance, there is shown a prior art transistor driver circuit for magnetic cores of the type used in storing bits of digital information in information handling machines. This circuit has been selected as an illustrative practical embodiment to assist in understanding the problem encountered in transistor circuitry as a result of inductance, and the effect of such elements on the voltage levels of the circuit. The term, inductive element, is considered as including circuit elements having substantially rectangular hysteresis loops. The best known members of this class of elements are the substantially rectangular hysteresis loop inductive elements, such as magnetic cores and switching transformers well known in the art.

In the circuit of FIGURE 1, a transistor 1 shown here as an NPN junction type transistor is connected with its emitter coupled through a current limiting resistor 2 to a power source shown as a battery 3. The remaining other terminal of battery 3 is connected to reference potential. A diode 4 is shown connected in the forward direction between reference potential and the emitter of transistor 1 for voltage limiting purposes, wherein the emitter of the transistor 1 is prevented from becoming negative with respect to reference potential by a potential greater than the forward potential difference across the diode 4. The base of transistor 1 is connected to a source of bias potential shown as battery 5 through a resistor 6, the combination of which operates to maintain a transistor 1 in the "off" condition in the absence of an input pulse. An input terminal 7 is provided to the base of transistor 1 for input signal introduction purposes. The collector of transistor 1 is connected to a power and bias source shown as battery 8 through an inductive element having remanence 9, known in the art as a switching transformer, by way of a winding 10. The switching transformer 9 is made up of a magnetic material having an essentially rectangular hysteresis loop. The remaining terminal of battery 8 is connected to reference potential. An output winding 11 is provided on the transformer 9 and, connected in series across the terminals thereof, are a plurality of magnetic cores 12, each capable of storing information by assuming one of two magnetic states, and an impedance 13. The substantially rectangular hysteresis loop material of the transformer 9 is reset to a different energy state of the hysteresis loop through a winding 14 shown as being energized by a battery 15, in series with a resistor 16, and switch 17.

*Operation*

The transistor in the illustrative prior art circuit of FIGURE 1 is employed as a current driver to provide, read, write and inhibit pulses in a manner well known in the art to operate magnetic core storage arrays symbolized in this illustration and identified by the numeral 12, and, in such operation, transistors of the type illustrated by 1 are required to conduct relatively large currents as well as to withstand a high emitter to collector voltage. The transistor 1 is normally in the non-conducting state by virtue of the fact that the base thereof is provided with sufficient bias through battery 5 and resistor 6, in series, to cause it to be more negative in this embodiment than the emitter. The potential level at the emitter is governed by the forward potential drop from reference across the diode 4. When an input pulse is applied at terminal 7 sufficient to overcome the reverse bias on the base of the transistor and place the base positive with respect to the emitter, the transistor 1 begins to conduct to a current value limited by the magnitude of resistor 2. In this state, the current flowing through the transistor flows through the winding 10 of the transformer 9. This current through the winding 10 supplies sufficient energy to cause the transformer 9 to switch from one position to the other of its rectangular hysteresis loop, thereby inducing a voltage across the secondary winding 11. The induced voltage in turn causes a current to flow along the line passing through the cores 12 symbolizing the core array and through the resistor 13, in series. Resistor 13 performs the function, when connected in series with the select line in the array of magnetic cores 12 of providing a fixed current magnitude through the cores in such a switching operation. Thus, through the proper selection of the magnitude of resistor 13, the number of cores that may be switched on the line will not have an appreciable influence on the current flowing on the line. The effect of resistor 13 is to insure that the current flowing in the line through the cores 12 will have the required amplitude, rise, and pulse duration for effective switching.

The series impedance made up of the winding on the cores 12 and resistor 13 will be reflected back into the primary winding 10 on the transformer 9 with its value changed by the multiplying factor $$\left[\frac{\text{number of turns on winding 10}}{\text{number of turns on winding 11}}\right]^2$$

therefore, under operating conditions with a transistor designed to conduct a specified current in the collector circuit, it will be necessary that transistor 1 be able to handle a collector supply voltage, as illustrated here as battery 8, which has a magnitude that is great enough to provide the desired current through the above described impedance. From the foregoing then, it will be apparent that although the collector to emitter voltage of transistor 1 may be as low as the saturation value for the designed current during conduction, the transistor 1 must be able to withstand the voltage of battery 8 when in the non-conducting state. In addition to this requirement, the inductive element which has been described above as comprising transformer 9 and cores 12, each having remanence in switching from one magnetic state to another on the hysteresis loop, will cause a voltage to be induced in the collector circuit of the transistor 1, illustrated here as including the primary winding 10 of the transformer 9. This induced voltage will be in addition to the voltage already present. It has been found that this induced voltage pulse is of a magnitude in the vicinity of the magnitude of the collector supply and of polarity such that it operates to increase the emitter to collector voltage appearing across the transistor 1, therefore, the transistor 1 in the prior art circuit of FIGURE 1, must be capable of withstanding approximately double the collector supply voltage of battery 8 during the switching operation.

Figure 2:
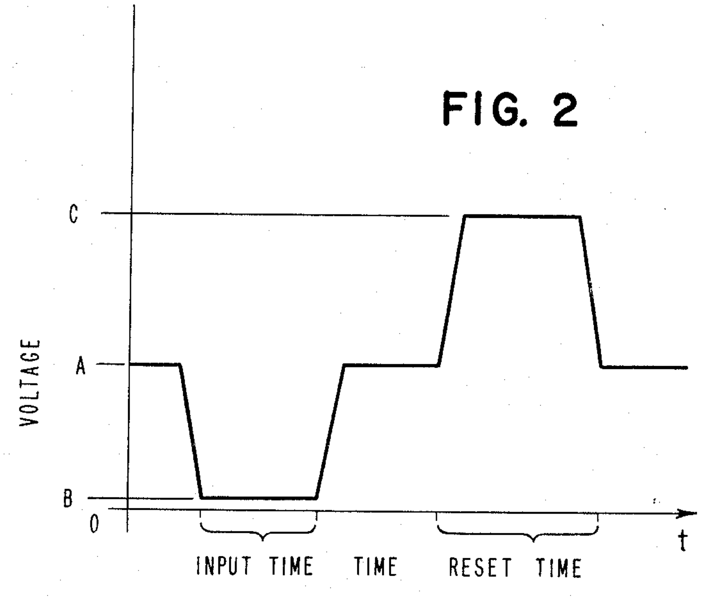
FIGURE 2 is a graph showing the emitter to collector voltage across the transistor in the circuit of FIGURE 1.

Referring now to FIGURE 2, a graph is shown wherein the emitter to collector voltage is plotted as the ordinate and time is plotted as the abscissa. From this graph, it may be seen that in the initial or off condition, that is, wherein transistor 1 is not conducting, the emitter to collector voltage is at an initial value A corresponding to a value of battery 8, and, at a time when an input signal is impressed, which time is labelled in the graph as input time, the emitter to collector voltage, as current flows through transistor 1, drops to the voltage represented by the current flowing through the impedance of the transistor circuit. This voltage is labelled as voltage B in FIGURE 2. At the end of the input time, conduction is interrupted through the transistor 1, and the emitter to collector voltage returns to value A. At this point the elements illustrated as transformer 9 and cores 12 are in the higher of their magnetic states. At a later time, when it is desired to return the inductive element, which in this illustration exhibits remanence to a lower energy position of the hysteresis loop, energy is delivered by closing switch 17 from battery 15 and resistor 16, in series, through winding 14 causing the transformer 9 to change remanent state. This time is labelled in the graph of FIGURE 2 as "reset time." The changing of remanent states causes a pulse to be delivered into the collector circuit of transistor 1 through the winding 10 on transformer 9 and operates to raise the emitter to collector voltage to the value labelled in the graph as Voltage C, so that during this transient, an emitter to collector voltage is impressed on the transistor 1 which is nearly double the optimum design value for the circuit. It will be apparent in connection with the above described problem, that where the inductive element involves remanence, the transient frequently occurs on resetting, whereas, where the inductive element has a conventional hysteresis loop, the transient frequently occurs on relaxation of current flow in the circuit.

In order to solve the problems above described in connection with FIGURE 1, the technique of this invention involves the providing of a pulsed collector supply for the semiconductor device serving as an element in a circuit wherein an inductive element is included so that the collector supply may be reduced at the time when this voltage transient caused by this reactive element appears and thereby to avoid exposing a semiconductor element to greater voltages than is needed for steady state operation.

Figure 3:
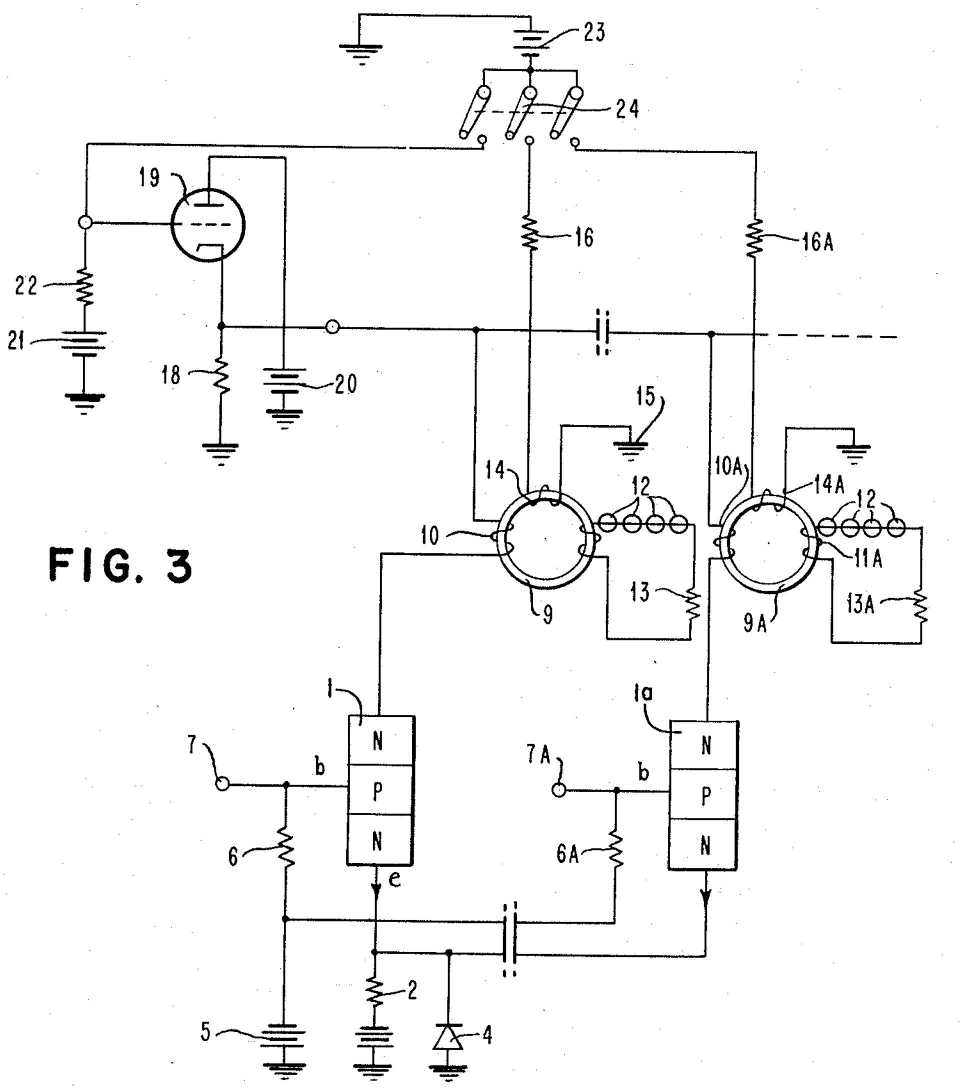
FIGURE 3 is a circuit along the lines of FIGURE 1 and containing a modification illustrating the principle of this invention.

Referring now to FIGURE 3, there is shown a circuit of the type shown in FIGURE 1, wherein the pulsed collector voltage technique of this invention is employed. In the circuit of FIGURE 3, a plurality of transistor driven magnetic core storage circuits of the general type described in connection with FIGURE 1 are shown, and, in each circuit like reference numerals for like components have been used. In FIGURE 3 the technique of this invention is illustrated by the providing of a variable source of collector voltage which will replace the battery 8 of FIGURE 1. This voltage comprises a cathode follower type circuit comprising a load resistor 18 having one terminal connected to reference potential and the other terminal connected to the output of an amplifying element 19 illustrated as the cathode of a triode vacuum tube. The plate of the amplifier 19 is connected to a power and bias source 20 having one terminal connected to reference potential. The grid of the amplifier 19 is held at a positive potential with respect to the cathode through the use of a battery 21 and resistor 22 to provide cathode follower action from the amplifier 19 as is well known in the art. A source of switching energy illustrated as battery 23 having one terminal connected to reference potential is provided through a selecting mechanism illustrated as a switch 24 to provide an input signal to each of the windings 14 and 14A for resetting purposes to the core storage systems previously described, and, simultaneously to actuate the variable collector voltage system so as to reduce the collector voltage appearing across the transistors 1 and 1A during the resetting operation. Since in memory systems of the type illustrated here, read, write, or inhibit pulses well known in the art may be operated at different time intervals through the illustrative winding 14, it will be apparent to one skilled in the art that a more sophisticated system than the one involving batteries 20 and 21 may be readily devised by anyone skilled in the art so long as a reduction in collector voltage is achieved simultaneously with the changing of magnetic conditions of transformers 9 and 9A. It will also be apparent to one skilled in the art that should energy of a different polarity be required for functional purposes well known in magnetic core systems, these may readily be provided along the general lines illustrated through elements 23 and 24.

Through employing the technique of this invention, the transistors 1 and 1A experience no greater collector to emitter voltage than the quiescent which is the optimum design value, either during the interval that conduction could occur, or during the reset interval. Considering first the non-conducting condition, no appreciable current is flowing through the transistor and the voltage difference across the transistor would be limited to the collector supply voltage value. In FIGURE 3, the collector voltage value would be determined by the steady state current flowing from reference potential through resistor 18 and tube 19 to battery 20 and hence, it would be apparent that under these conditions, essentially no voltage drop would appear across the primary windings 10 and 10A of transformers 9 and 9A.

Figure 4:
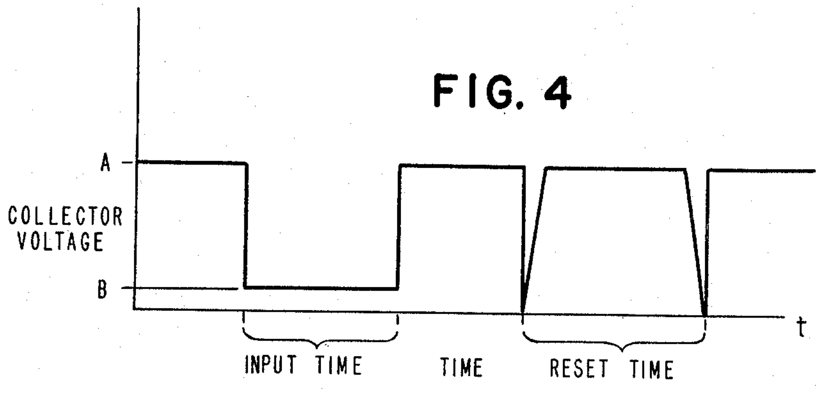
FIGURE 4 is a graph showing the emitter to collector voltage across the transistor drivers in the circuit of FIGURE 3.

This may be seen by referring now to FIGURE 4, wherein a graph is shown describing the emitter to collector voltage appearing across the semiconductor device in the circuit of this invention as illustrated in FIGURE 3. In the graph of FIGURE 4 in the above described no signal condition, the voltage appearing between emitter and collector across the transistors 1 and 1A of FIGURE 3 is labelled Voltage A which, as previously described, is determined by a steady state current flowing in the circuit comprising resistor 18, tube 19 and battery 20. The next condition occurs at a time labelled "input time." When an input appears at either terminal 7 or 7A initiating conduction in either transistor 1 or 1A or both, the current flowing through the transistor reduces the emitter to collector voltage to a lower level labelled Voltage B. At the end of the input time, the emitter to collector voltage returns to the no signal value, as previously described. Another condition occurs at a time labelled "reset time." In resetting, switch 24 is closed and the closing of the switch 24 operates to supply current from the battery 23 through the windings 14 and 14A to return transformers 9 and 9A to another remanence condition of the hysteresis loop and at the same time to deliver an input pulse to the tube 19, which operates to reduce the collector supply voltage of each of the transistors to an amount such that the increase in potential impressed upon the collector leads due to the switching of transformers 9 or 9A, does not provide an emitter to collector voltage in excess of the design value of transistors 1 or 1A. As may be seen from FIGURE 4 at reset time, the cathode follower type circuit comprising elements 18, 19 and 20 reduces the collector voltage essentially to reference potential so that when the transformers are switched, the induced voltage rises to a value not exceeding a steady state value, namely Voltage A. At the end of switching, the steady state value is again re-established as illustrated by the curve returning from reference to the steady state collector voltage A.

It will be apparent to one skilled in the art that the "cathode follower type" circuit for the reducing of the collector voltage may be replaced by similar semiconductor type circuits and other switching circuitry capable of achieving the desired reduction in potential appearing across the semiconductor device.

What has been described is a technique of operating semiconductor devices, wherein inductive elements in the circuit are prevented from providing potentials on the transistor in excess of the design value.

While there have been shown and described and pointed out the fundamental novel features of the invention as applied to a preferred embodiment, it will be understood that various omissions and substitutions and changes in the form and details of the device illustrated and in its operation may be made by those skilled in the art without departing from the spirit of the invention. It is the intention, therefore, to be limited only as indicated by the scope of the following claims.

What is claimed is:

1. A control circuit comprising, in combination, a semiconductor circuit element, a source of potential having a predetermined magnitude, an inductive element, means including said source of potential for providing current flow through said semiconductor circuit element, means coupling said inductive element to said means for providing current flow through said semiconductor circuit element and means independent of the magnetic state of the inductive element for selectively changing the magnitude of said source of potential at times corresponding to certain changes in magnetic state of said inductive element.

2. The control circuit of claim 1 wherein said semiconductor circuit element is a transistor.

3. The control circuit of claim 1, wherein said inductive element includes at least one magnetic core capable of assuming two remanent conditions of operation.

4. An energy control circuit comprising a semiconductor circuit element, an inductive element having signal input means, a plurality of magnetic states, means including said semiconductor circuit element and said signal input means for producing changes in magnetic state of said inductive element and means coupled to said semiconductor circuit element and responsive to said signal input means for counteracting the voltage changes produced by certain changes in magnetic state of said inductive element thereby protecting said semiconductor circuit element.

5. The energy control circuit of claim 4 wherein said semi-conductor circuit element is a transistor.

6. The energy control circuit of claim 5 wherein said inductive element includes at least one magnetic core capable of assuming two remanent conditions of operation.

7. An energy control circuit comprising, in combination, a plurality of transistor circuit branches, each branch including the current path from emitter to collector of a transistor, an inductive element having a plurality of magnetic states coupled to said current path, a variable power source connected to said current path for providing current flow through said transistor, and means independent of the magnetic state of the inductive element for varying the magnitude of said power source during certain changes in magnetic states of said inductive element.

8. An energy control circuit of claim 7 wherein said inductive element includes a switching transformer.

9. The circuit of claim 7 wherein said inductive element includes at least one magnetic core capable of assuming two remanent conditions of operation.

10. An energy control circuit comprising, in combination, a plurality of current branches, each current branch including a transistor, signal input means, means for providing current flow from emitter to collector of said transistor, an inductive element having a plurality of magnetic states coupled to each of said current branches and means coupled to each of said current branches and responsive to said signal input means for counteracting said means for providing current during certain changes in magnetic states of said inductive element thereby protecting the transistor.

11. The energy control circuit of claim 10 wherein said transistor is a NPN type circuit.

12. The energy control circuit of claim 10 wherein said inductive element includes a switching transformer.

13. The energy control circuit of claim 10 wherein said inductive element includes at least one magnetic core capable of assuming two remanent conditions of operation.

14. A semiconductor energy control circuit comprising, in combination, a reference potential, at least one current branch including a transistor having at least emitter and collector connection, a current limiting impedance, an inductive element having remanence, a source of variable potential, means providing a current path from said source of variable potential to said reference potential through said emitter to collector path of said transistor and said current limiting impedance in series, means for changing the remanent state of said inductive element and means for reducing the magnitude of said source of potential during changes of remanence state of said inductive element.

15. A transistor circuit comprising, a reference potential, at least one current branch including a transistor having emitter, base and collector connections, a current limiting resistor having a first terminal connected to said emitter connection of said transistor and having the remaining terminal thereof connected to said reference potential, an inductive element having remanence, means coupling said inductive element to the collector of said transistor, a variable source of potential, means coupling said variable source of potential to said collector of said transistor, bias means connected to said base connection of said transistor for preventing current flow through said transistor, signal introduction means connected to said base of said transistor and operable to overcome said bias means, and means for reducing the magnitude of said variable potential source during changes in remanence of said inductive element.

16. The circuit of claim 15 wherein said inductive element includes a switching transformer.

17. The circuit of claim 15 wherein said inductive element includes at least one magnetic core capable of assuming two remanent conditions of operation.

References Cited in the file of this patent

UNITED STATES PATENTS

| | | |
|---|---|---|
| 2,655,608 | Valdes | Oct. 13, 1953 |
| 2,710,928 | Whitney | June 14, 1955 |
| 2,772,370 | Bruce | Nov. 27, 1956 |
| 2,798,169 | Eckert | July 2, 1957 |
| 2,809,303 | Collins | Oct. 8, 1957 |
| 2,832,900 | Ford | Apr. 29, 1958 |
| 2,884,545 | Houck | Apr. 28, 1959 |